United States Patent [19]

Bellis

[11] 3,894,330

[45] July 15, 1975

[54] MANUFACTURE OF CONDUCTIVE ARTICLES

[75] Inventor: Harold Edward Bellis, Hockessin, Del.

[73] Assignee: E. I. du Pont de Nemours & Co., Wilmington, Del.

[22] Filed: July 9, 1973

[21] Appl. No.: 377,569

Related U.S. Application Data

[63] Continuation-in-part of Ser. No. 119,813, March 1, 1971, abandoned.

[52] U.S. Cl. .................................. 228/254; 148/6.3

[51] Int. Cl. ............................ B44d 1/18; B44d 1/14

[58] Field of Search .... 117/212, 217, 130 E, 130 B, 117/227

[56] References Cited

UNITED STATES PATENTS

| | | | |
|---|---|---|---|
| 2,702,252 | 2/1955 | Suchoff | 117/212 |
| 2,803,216 | 8/1957 | Termini et al. | 117/212 |
| 2,909,833 | 10/1959 | Murray et al. | 117/212 |
| 3,338,726 | 8/1967 | Berzins | 117/130 B |
| 3,522,085 | 7/1970 | Watanabe | 117/212 |
| 3,582,458 | 6/1971 | Haller | 161/213 |
| 3,616,196 | 10/1971 | Sun et al. | 161/197 |

*Primary Examiner*—Cameron K. Weiffenbach

[57] ABSTRACT

A process for producing conductive articles suitable for use as printed circuit boards is provided. These articles comprise an inner substrate having at least one ply of fibrous sheet material (glass fabric) impregnated with a polyimide resin, and a conductive metal such as nickel, copper or silver bonded to at least a portion of at least one surface of the inner substrate. The process comprises (1) electrolessly depositing an essentially continuous nickel/boron alloy coating on the conductive metal portion, the alloy having a boron content of from about 0.1 to 15 percent by weight, based on the weight of alloy, and (2) soldering the coated article. The electroless nickel/boron coating permits greater flexibility in soldering, especially when the article has been heated in air.

4 Claims, No Drawings

MANUFACTURE OF CONDUCTIVE ARTICLES

CROSS REFERENCE TO RELATED APPLICATION

This is a continuation-in-part of application Ser. No. 119,813, filed Mar. 1, 1971, Bellis, assigned to the assignee of the present application now abandoned.

BACKGROUND OF THE INVENTION

1. Field of Invention

This invention relates to laminated articles and more particularly to a process for making conductive laminated and soldered articles suitable for use as printed circuit boards.

2. Prior Art

In U.S. Pat. No. 3,616,196, granted to Theodore Shell and George C. Sun and assigned to the assignee of the present application, is described a laminated article which is quite useful in the manufacture of printed circuit boards, particularly such boards made and/or used at elevated temperatures. However, copper or nickel foil bonded to the laminate has the disadvantage of forming oxides at the elevated temperatures; thus, these oxides adversely affect the adherence of conventional solders during repeated bonding of various electronic elements to the board. This is particularly important in reflow soldering, consecutive soldering at progressively lower temperatures, and repair of previously soldered articles. It is therefore desirable to have a circuit board in which the bonded metal foil does not oxidize and which will not adversely affect or alter the subsequent operations carried out in the manufacture of printed circuits.

SUMMARY OF INVENTION

According to the present invention there is provided a process for making a laminated and soldered article of manufacture comprising an inner substrate having at least one ply of fibrous sheet material impregnated with a polymeric precursor of a polyimide resin, said resin being the reaction product of an anhydride component and an amine component, a conductive metal bonded to at least a portion of at least one surface of said inner substrate. The process comprises electrolessly depositing an essentially continuous nickel/boron alloy coating on said conductive metal portion and then soldering the article. The deposited alloy has a boron content of from about 0.1 to 15 percent by weight, based on the weight of alloy. The soldering is preferably done in the presence of a noncorrosive rosin-based flux. The invention is particularly effective in soldering articles which have been exposed to air at temperatures of at least about 215°C. for at least about one minute as in previous soldering operations. For the nickel/boron coating, a boron content of about 0.1 to 2 percent by weight and a thickness of at least 0.02 mils or 0.02 to 5 mils are preferred.

DETAILED DESCRIPTION OF INVENTION

The inner substrate of the present invention is at least one ply, and preferably a plurality of plies, of sheet material impregnated with a polyimide resin, the precursors for which are the polyamide-acids, polyamide-esters and polyamide-amic acids. Various polyamide-acid precursors are described in Edwards U.S. Pat. No. 3,179,614 issued Apr. 20, 1965; Lavin et al. U.S. Pat. No. 3,190,856 issued June 22, 1965; Frost et al. U.S. Pat. No. 3,179,635 issued Apr. 20, 1965 and Lorcrini U.S. Pat. No. 3,182,073 issued May 4, 1965. Polyamide-esters are described in Sorenson U.S. Pat. No. 3,312,663 issued Apr. 4, 1967, while a class of polyamide-amic acids are described in Lavin et al. U.S. Pat. No. 3,260,691 issued July 12, 1966. The disclosure of each of the above references is hereby incorporated herein in its entirety.

Preferred polyimide precursor polymers are the polyamide-acids set forth in U.S. Pat. No. 3,179,614, and have the following general formula:

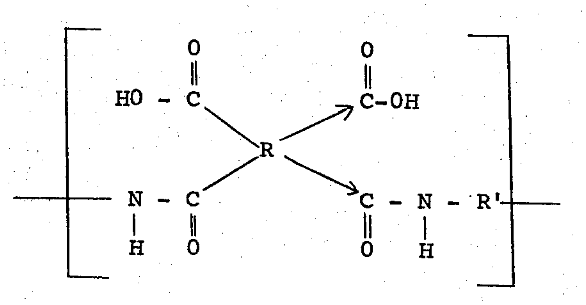

wherein → denotes isomerism; wherein R is a tetravalent organic radical containing at least 2 carbon atoms, no more than 2 carbonyl groups of each polyamide-acid unit being attached to any one carbon atom of said tetravalent radical; wherein R′ is a divalent radical containing at least 2 carbon atoms, the amide groups of said adjacent polyamide-acid units each attached to separate carbon atoms of said divalent radical; and wherein n is an integer sufficient to provide an inherent viscosity of at least 0.1, preferably 0.3 to 5.0 as measured as a 0.5 percent by weight solution in N,N-dimethylacetamide at 30°C.

These polyamide-acids are prepared by reacting at least one organic diamine with at least one tetracarboxylic acid dianhydride using solvents and under conditions set forth in U.S. Pat. No. 3,179,614. Specific diamines and dianhydrides are also set forth, but benzophenonetetra-carboxylic acid dianhydride and metaphenylene diamine are preferred.

While not necessary, it is preferred that inert thermally stable materials be admixed with the polymeric precursor of the imide-containing polymer. Such materials are colloidal particles of the following materials: carbon black, polyimide molding powder such as described in Shellbourne, U.S. Pat. No. 3,249,588 issued May 3, 1966, barium titanate, potassium titanate, magnesium sulfate, titanium dioxide, asbestos, magnetic iron oxide ($Fe_3O_4$), ferric oxide ($Fe_2O_3$), aluminum powder, potassium sodium tartrate, ammonium dihydrogen phosphate, non-abrasive amorphous alumina and non-abrasive amorphous silica as in glass microballoons, preferably barium titanate. The class of non-abrasive silica also includes the various forms of "Ludox" colloidal silicas; "Celite" diatomaceous silica (Largely $SiO_2$, plus $Al_2O_3$, $Fe_2O_3$, $TiO_2$, CaO and MgO) Synthamica (a synthetic mica made from a stoichiometric ratio of $SiO_2$, $Al_2O_3$, MgO, potassium silica fluoride and potash feldspar); "Hi-Sil" silica (a hydrated silica of high purity and very fine particle size); "Cab-O-Sil" colloidal silica; and sepiolite (meerschaum; a hydrated magnesium silicate). Some forms of non-abrasive alumina are boehmite (a form of bauxite, $Al_2O_3H_2O$); "Celite" diatomaceous silica (see above); and "Bentone" 18 (a magnesium/calcium/aluminum/silicon complex oxide attached electrovalently to an organic ammonium cation). Colloidal silica has been found to be an especially useful material. These particles are characterized by having essentially spherical shape, particle diameter below 0.1 micron, and a surface area of 200 to 300 square meters per gram.

The content of inert, thermally stable, colloidal particles will ordinarily be at least about 0.5 percent by weight based on the combined weight of the anhydride component and the amine component of the polymeric precursor and no reason is seen at the present time to exceed about 20 percent. Usually proportions within the range of 3 to 12 percent and preferably in the range of 5 to 10 percent provide satisfactory results when a balance of factors are considered, including reduction of void content, increased thermal stability and increased retained flexural strength at elevated temperatures.

The precursor can be admixed with the particles or the particles can be admixed with the precursor at any stage in the preparation of the precursor For example, the particles can be admixed with the solution in the organic solvent of one or both of the reactants before, during or after the formation of the precursor, or the particles may be admixed with the organic solvent prior even to the introduction of the reactants of the precursor. Preferably, the particles are admixed with a solution of the precursor.

Suitable methods of mixing the polymeric precursor and the colloidal particles include normal and high-speed stirring, sand milling as is described in Hockberg, U.S. Pat. No. 2,581,414 issued Jan. 8, 1952, and Hockberg and Bosse, U.S. Pat. No. 2,855,156 issued Oct. 7, 1958, ball milling, two-roll milling or other methods used in the preparation of pigment dispersions.

Fibrous sheet materials suitable for resin impregnation are those stable at a temperature over 200°C. and more preferably over 400°C. and include No. 104, No. 108, No. 112 and No. 116 weave glass fabric; heavier grades of glass fabric such as No. 181 weave; glass cloth wherein the yarn is not twisted and plied, such as No. 7721 glass cloth, glass sheets prepared from parallel glass fibers; glass fibers; asbestos fibers and sheets prepared from such fibers, and similar fibers and sheets prepared therefrom.

Any suitable method can be used to impregnate the fibrous material. For example, the fibrous material can be coated with the precursor composition or the particle-precursor composition or it can be immersed in such composition.

Often, the precursor is of such viscosity that it is tacky or sticky, thus making it difficult to store and handle the impregnated sheets. Therefore, it is often desirable to remove some of the solvent that may be present and to partially cure, i.e., partially convert the polyamideacid precursor to an imide-containing structure, so that the sheet will be less sticky or tacky. This removal of solvents and conversion can be accomplished by heat or any of the other methods described in the above-mentioned patents. Usually such partially cured sheets will be about 5 percent to about 99.5 percent converted to a polyimide resin. Preferably, these sheets will be about 90 to about 99.5 percent converted.

Such partially cured sheets are useful since they can be sold to processors who will then convert them into laminates.

Any suitable method can be used for laminating the impregnated sheets. Usually, this involves the simultaneous application of heat or other means to fully convert the precursor that it impregnated in the fibrous sheet to a polyimide resin, pressure to consolidate the individual sheets into a unitary laminate, and vacuum, if desired, to draw off volatiles that are evolved during the final conversion of the precursor to the polyimide resin. In making the laminate, as many plies as desired can be used, but it is generally preferred that the laminate have a thickness within the range of 5 mils for flexible applications to 250 mils. Generally, the laminate will vary in thickness from 10 mils to 125 mils, but will usually be around 60 to 70 mils in thickness.

In preparing printed circuits from these laminates, it is necessary to adhere a conductive metal to a portion (or all) of at least one surface of the laminate. Preformed metal sheets or foils of desired thickness, e.g. 0.5 to 5 mils, preferably 1 to 2 mils, and with or without a nickel/boron alloy precoat, are bonded to one or both surfaces of the above-prepared laminate. The conductive metal sheet can be nickel, copper, silver or any other of the conductive precious metals, but it is preferred that the sheet be nickel or copper.

In order to improve the solderability of printed circuits prepared from the laminated articles described above, the conductive metal has applied thereto an essentially continuous coating of a nickel/boron alloy having about 0.1 to 15 percent by weight, preferably 0.1 to 2 percent, boron in the alloy and being at least 0.02 mil in thickness. The upper limit of thickness is not critical and is governed by cost and time required for putting on the coating, but the coating is usually in the range of 0.02 to 5 mils, preferably 0.1 to 1 mil. A continuous nickel/boron alloy coating is one which when viewed at a magnification of 20 × through a microscope shows no discontinuity, i.e., the underlying base metal is not apparent in the field of view. For example, if copper is the under-lying metal, there will be no reddish color discernible. The nickel/boron alloy coating has been characterized as being essentially continuous since, if a discontinuity occurs in a non-significant area, the discontinuity will not adversely affect solderability.

The nickel/boron alloy coating is applied by electroless deposition from an amine-borane containing plating bath according to the teachings of Berzins U.S. Pat. No. 3,338,726 issued Aug. 29, 1967, the entire contents of which are incorporated by reference. Coatings can also be applied by the borohydride electroless plating bath of Berzins U.S. Pat. No. 3,096,182 issued July 2, 1963, the entire contents of which are incorporated by reference.

Soldering according to the invention preferably uses non-corrosive rosin-based fluxes well known in the trade such as those which meet U.S. Military Specification MIL-F-14256CA, inlcuding "Dutch Boy" 105, 110 and 115, "Alpha" 100 and 611, and "Kester" 196. The invention is further illustrated by the following examples in which parts and percentages are by weight unless otherwise indicated.

CONTROL EXAMPLE 1

Circuit boards of aromatic polyimide reinforced with fiberglass and clad with copper foil and nickel foil were each tested for solderability after exposures in air for 1 hr. at temperatures from 200° to 450°C. Both the copper and nickel surfaces visibly tarnished above 200°C. and were no longer solderable using 60/40 tin/-lead solder and a noncorrosive rosin-based flux ("Dutch Boy" 115).

| Metal Surface | Flux Used | Solderability after 1 hr. at 20°C. | 200°C. | 300°C. | 350°C. | 400°C. | 450°C. |
|---|---|---|---|---|---|---|---|
| Copper | No | Yes | No | | | | |
| Copper | Yes | Yes | Yes | No | No | No | No |
| Nickel | No | Yes | No | | | | |
| Nickel | Yes | Yes | Yes | No | No | No | No |

Throughout this application the term "solderable" means that over 95% of surface was wet by solder in 20 seconds in solder bath at a temperature of 215°C. This example shows the inherent weakness of conventional copper and nickel to passivation at elevated temperatures.

CONTROL EXAMPLE 2

The tests of Control Example 1 were repeated with circuit boards electrolytically coated with nickel and other circuit boards electrolessly coated with a nickel/-phosphorus alloy. Standard techniques well known in the art were used for each type of coating.

The coated circuit boards were tested for solderability using the same noncorrosive flux after exposure to air for 1 hour at temperatures from 20°C. to 450°C. Solderability was exhibited after exposure to temperatures up to 200°C. but not at 300°C. The results are presented below:

| Metal Surface | Solderability after 1 hr. at 20°C. | 200°C. | 300°C. | 350°C. | 400°C. | 450°C. |
|---|---|---|---|---|---|---|
| Electrolytic Nickel | Yes | Yes | No | No | No | No |
| Ni-P | Yes | Yes | No | No | No | No |

EXAMPLE 1

The tests of Control Example 1 were repeated with the copper clad circuit board after applying a 0.1 mil coating of nickel-boron onto the copper foil (0.5% boron, remainder nickel) according to U.S. Pat. No. 3,338,726.

| Metal Surface | Flux Used | Solderability after 1 hr. at 20°C. | 200°C. | 300°C. | 350°C. | 400°C. | 450°C. |
|---|---|---|---|---|---|---|---|
| Nickel-boron | No | Yes | Yes | No | | | |
| Nickel-boron | Yes | Yes | Yes | Yes | Yes | Yes | No |

Thus, the application of a nickel-boron coating to the surface of copper extends its useful life from 200°C. to over 400°C. This test was repeated with nickel-boron over the nickel clad circuit board with the same result.

EXAMPLE 2

The tests of Control Example 1 were repeated with the copper clad circuit board after applying a 0.1 mil coating of nickel-boron onto the copper foil (5% boron, remainder nickel and stabilizer) according to U.S. Pat. No. 3,096,182.

| Metal Surface | Flux Used | Solderability after 1 hr. at 20°C. | 200°C. | 300°C. | 350°C. | 400°C. | 450°C. |
|---|---|---|---|---|---|---|---|
| Nickel-boron | No | Yes | Yes | No | | | |
| Nickel- | Yes | Yes | Yes | Yes | Yes | No | |

As in Example 1, the presence of the nickel-boron coating increased the useful life of the material from 200°C. to over 350°C. This test was repeated with nickel-boron over the nickel clad circuit board with the same result.

EXAMPLE 3

In this example the nickel-boron (0.5% boron, remainder nickel) coating thickness was varied over copper clad circuit boards and the solderability recorded after 1 hr. in air at 400°C.

| Coating Thickness (Microinches) | Solderability |
|---|---|
| 2 | No |
| 20 | >90% coverage, but pitted |
| 50 | >99%, few pits |
| 100 | 100% |

This example shows that the solderability increases with the thickness of the nickel-boron coating.

EXAMPLE 4

In this example, 1.5 mil copper foil was coated with 0.1 mil nickel-boron (0.5% boron, remainder nickel), as in Example 1, on both sides and then laminated to a circuit board of aromatic polyimide reinforced with fiberglass in the same conventional manner used to laminate copper foil. Whereas the bond strength between the copper and polyimide in a peel test using one-eighth inch square patterns with a wire soldered to a one-eighth inch square which is then pulled to rupture was about 10 pounds pull, the nickel-boron bond with polyimide was 25 pounds pull.

EXAMPLE 5

A nickel-boron (0.5% boron, remainder nickel) coating was applied as in Example 1 to a pattern developed by etching the copper of the copper clad circuit board prior to plating with nickel-boron. The nickel-boron coated the edges of the copper as well as the surface rendering the composite still bondable after 250 hr. in air at 260°C. The same pattern was produced by etching after the nickel-boron coating had been applied. There was some attack with delamination at the nickel-copper interface. By contrast, the same pattern produced in uncoated copper laminated board delaminated over the surface after this treatment due to air oxidation at the substrate copper interface.

EXAMPLE 6

The nickel-boron (0.5% boron, remainder nickel) coated copper clad circuit board of Example 1 was soldered easily by a variety of solders and non-corrosive fluxes, e.g., 60 Sn/40 Pb, 95 Sn/5 Ag, 95 Sn/5 Sb, 90 Pb/10 Sn ("Formon" solders sold by E. I. du Pont de Nemours and Company).

EXAMPLE 7

A nickel-boron (0.5% boron, remainder nickel) coating was applied to copper particles adhesively bonded to a circuit board of aromatic aromatic polyimide reinforced with fiberglass. The resistivity of the commposite was 4.5 ohms per square before plating with nickel-boron. After plating with 0.09 mil nickel-boron, the resistivity was improved to 0.01 ohms per square. The metal surface was then easily solderable, whereas prior to coating it was not solderable even with corrosive fluxes.

What is claimed is:

1. A process for making a laminated and soldered article of manufacture comprising an inner substrate having at least one ply of fibrous sheet material impregnated with a cured polymeric precursor of a polyimide resin, said resin being the reaction product of an anhydride component and an amine component, and a conductive metal bonded to at least a portion of at least one surface of said inner substrate, said process comprising (1) electrolessly depositing an essentially continuous nickel/boron alloy coating on said conductive metal portion of said article, said alloy having a boron content of from about 0.1 to 15 percent by weight, based on the weight of alloy, (2) heating said article of manufacture in an oxidizing atmosphere at a temperature of at least about 215°C. for at least about one minute, and (3) soldering the coated article.

2. The process of claim 1 in which the soldering is carried out in the presence of a non-corrosive, rosin-based flux.

3. The process of claim 1 wherein said nickel/boron alloy is deposited to a thickness of at least 0.02 mil.

4. The process of claim 3 wherein the nickel/boron alloy has a boron content within the range of about 0.1 to 2 percent by weight and the coating is deposited to a thickness in the range of 0.02 to 5 mils.

* * * * *